United States Patent
Tihanyi et al.

Patent Number: 5,815,027
Date of Patent: Sep. 29, 1998

[54] CIRCUIT CONFIGURATION FOR DETECTING A LOAD CURRENT OF A POWER SEMICONDUCTOR COMPONENT WITH A SOURCE-SIDE LOAD

[75] Inventors: Jenoe Tihanyi, Kirchheim, Germany; Adam-Istvan Koroncai, Klagenfurt, Austria

[73] Assignee: Siemens Aktiengesellschaft, Munich, Germany

[21] Appl. No.: 660,500

[22] Filed: Jun. 7, 1996

[30] Foreign Application Priority Data

Jun. 7, 1995 [DE] Germany ......................... 195 20 735.1

[51] Int. Cl.⁶ ................................................. G01R 19/165
[52] U.S. Cl. ............................................. 327/543; 327/538
[58] Field of Search ..................................... 327/530, 538, 327/543, 427, 431, 434, 436, 437; 323/316

[56] References Cited

U.S. PATENT DOCUMENTS

| | | | |
|---|---|---|---|
| 4,885,477 | 12/1989 | Bird et al. | 327/543 |
| 4,910,455 | 3/1990 | Nadd | 324/123 |
| 5,097,456 | 3/1992 | Kotowski et al. | 327/427 |
| 5,652,540 | 7/1997 | Eilley | 327/77 |

FOREIGN PATENT DOCUMENTS

| | | |
|---|---|---|
| 0 227 149 A | 7/1987 | European Pat. Off. |
| 0 247 995 A | 7/1988 | European Pat. Off. |
| 0274995 | 7/1988 | European Pat. Off. |
| 0 438 363 A | 7/1991 | European Pat. Off. |
| 2 642 176 A | 7/1990 | France |
| 68904664 | 9/1993 | Germany |

OTHER PUBLICATIONS

An article entitled "Surviving Short Circuits" by R. Frank and A. Pshaenich, in Machine Design, Mar. 8, 1990, pp. 89–96.

Primary Examiner—Timothy P. Callahan
Assistant Examiner—T. T. Lam
Attorney, Agent, or Firm—Herbert L. Lerner; Laurence A. Greenberg

[57] ABSTRACT

A field-effect-controllable power semiconductor component has a drain terminal, a source terminal, a gate terminal, a drain-to-source voltage and a load current. A circuit configuration for detecting the load current of the power semiconductor component includes a further field-effect-controllable semiconductor component through which a fraction of the load current flows. The further semiconductor component has a drain terminal connected to the drain terminal of the power semiconductor component, a gate terminal connected to the gate terminal of the power semiconductor component, a source terminal and a drain-to-source voltage. A resistor at which a voltage proportional to the load current can be picked up, is connected to a fixed potential terminal. A controllable resistor is connected between the resistor and the source terminal of the further semiconductor component. The controllable resistor adjusts the current of the further semiconductor component so that the drain-to-source voltages of the power semiconductor component and the further semiconductor component are equal to one another.

5 Claims, 2 Drawing Sheets

CIRCUIT CONFIGURATION FOR DETECTING A LOAD CURRENT OF A POWER SEMICONDUCTOR COMPONENT WITH A SOURCE-SIDE LOAD

BACKGROUND OF THE INVENTION

FIELD OF THE INVENTION

The invention relates to a circuit configuration for detecting a load current of a field-effect-controllable power semiconductor component, including a further field-effect-controllable semiconductor component, the drain terminals and the gate terminals of the two semiconductor components are connected to one another, a fraction of the load current flows through the further semiconductor component, and a resistor at which a voltage proportional to the load current can be picked up is connected in series with the further semiconductor component.

One such circuit configuration has been described, for instance, in an article entitled "Surviving Short Circuits" by R. Frank and A. Pshaenich, in Machine Design, Mar. 8, 1990, pages 89–96. That article illustrates a principle which is that the load current of a power MOSFET can be detected by connecting a similar, smaller-area MOSFET parallel to the power MOSFET and connecting a measuring resistor in series with the smaller MOSFET, the so-called "sense" FET, on the source side. If the power FET is connected on the drain side to a load, then a current flows through the further FET that is approximately proportional to the load current. The proportionality factor depends on the ratio between the current-carrying areas of the sense FET and that of the power FET. If a load current flows through the load and therefore through the power FET, then a portion that is approximately proportional to the load current thus flows through the sense FET and the measuring resistor. A voltage being approximately proportional to the load current can then be picked up at the measuring resistor.

The prerequisite in that case is that the measuring resistor be adapted to the load. In the case of a different load, either the measuring resistor or the evaluation logic that detects the voltage must therefore be modified.

SUMMARY OF THE INVENTION

It is accordingly an object of the invention to provide a circuit configuration for detecting a load current of a power semiconductor component with a source-side load, which overcomes the hereinafore-mentioned disadvantages of the heretofore-known devices of this general type and which is usable regardless of the magnitude of the load. Moreover, it should be usable in the case of a "high-side" switch, which is the most common.

With the foregoing and other objects in view there is provided, in accordance with the invention, a circuit assembly, comprising a field-effect-controllable power semiconductor component having a drain terminal, a source terminal, a gate terminal, a drain-to-source voltage and a load current; and a circuit configuration for detecting the load current of the power semiconductor component, the circuit configuration including a further field-effect-controllable semiconductor component through which a fraction of the load current flows, the further semiconductor component having a drain terminal connected to the drain terminal of the power semiconductor component, a gate terminal connected to the gate terminal of the power semiconductor component, a source terminal and a drain-to-source voltage, a fixed potential terminal, one resistor at which a voltage proportional to the load current can be picked up, the one resistor being connected to the fixed potential terminal and being connected in series with the further semiconductor component, and a controllable resistor connected between the one resistor and the source terminal of the further semiconductor component, the controllable resistor adjusting the current of the further semiconductor component for setting the drain-to-source voltages of the power semiconductor component and the further semiconductor component equal to one another.

If the circuit configuration is operated with an IGBT and not with a power MOSFET, then the term "source" should be replaced by the term "emitter".

In accordance with another feature of the invention, there is provided a differential amplifier having a first input connected to the source terminal of the power semiconductor component, a second input connected to the source terminal of the further semiconductor component and an output, the controllable resistor being a MOSFET having a control input connected to the output of the differential amplifier.

In accordance with a further feature of the invention, the differential amplifier is an operational amplifier.

In accordance with an added feature of the invention, the fixed potential terminal is a ground potential terminal.

In accordance with an additional feature of the invention, the power semiconductor component and the further semiconductor component have similar $I_D/U_{DS}$ characteristic curves.

In accordance with yet another feature of the invention, the power semiconductor component and the further semiconductor component include many cells integrated on a single chip.

In accordance with a concomitant feature of the invention, there is provided a further differential amplifier having a first input connected to the drain terminal of the power semiconductor component and a second input receiving a voltage being greater than an offset voltage of the first differential amplifier connected to the controllable resistor.

Other features which are considered as characteristic for the invention are set forth in the appended claims.

Although the invention is illustrated and described herein as embodied in a circuit configuration for detecting a load current of a power semiconductor component with a source-side load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
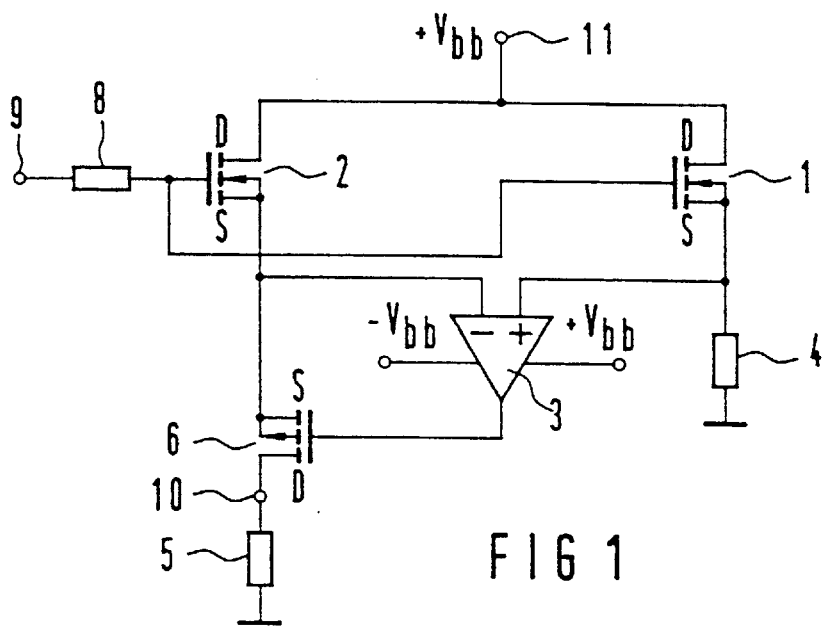
FIG. 1 is a schematic diagram showing a basic layout of a circuit configuration according to the invention.

Referring now to the figures of the drawings in detail and first, particularly, to FIG. 1 thereof, there is seen a circuit which includes a power MOSFET 1 with which a load 4 is connected in series on the source side. It thus represents a high-side switch. The circuit also includes a further MOSFET 2. This elements forms the aforementioned sense FET and is generally formed by several cells of the power MOSFET 1. For instance, it can have 10 cells, while the power MOSFET 1 has 10,000 cells. Drain terminals D of the two MOSFETs are connected to one another, as are their gate terminals. Source terminals of the two MOSFETs are separated. A controllable resistor 6 is connected on one hand to the source terminal of the MOSFET 2. The controllable resistor is connected on the ther hand to one terminal 10 of a measuring resistor 5. Another terminal of the one or measuring resistor 5 is applied to a fixed potential, preferably ground. This ground may, but need not necessarily, be identical to that to which the load 4 is connected.

The controllable resistor 6 is suitably constructed as a MOSFET. In that case, it has a source terminal connected to the measuring resistor 5 and a drain terminal connected to the source terminal of the MOSFET 2. The MOSFET 6 is of the opposite channel type to that of the MOSFET 2. A gate terminal of the MOSFET 6 is connected to an output of a differential amplifier 3. The differential amplifier 3 has two inputs, namely a negative or first input connected to the source terminal of the MOSFET 2 and a positive of second input connected to the source terminal of the power MOSFET 1.

The entire configuration is connected to an operating voltage $+V_{bb}$, which is applied between a terminal 11 and ground. The terminal 11 is connected to the drain terminals of the MOSFETs 1 and 2. The gate terminals of the MOSFETs 1 and 2 are connected through a resistor 8 to an input 9, at which a control voltage can be applied, for instance through a pump circuit.

If a control voltage is applied to the input 9, then the power MOSFET 1 and the further MOSFET 2 are made conducting. A load current flows through the load 4. A current likewise flows through the MOSFET 2, the controllable resistor 6 and the measuring resistor 5. The result at the source terminals of each of the MOSFETs 1 and 2 is a voltage that is respectively applied to the negative and positive inputs of the differential amplifier 3. A voltage that controls the MOSFET 6 appears at the output of the differential amplifier 3 as a function of the difference between these voltages.

It will be assumed for now that the source-to-drain voltage at the MOSFET 2 is greater than that at the MOSFET 1. In that case, a voltage occurs at the input of the differential amplifier 3 that controls the MOSFET 6 to a region of higher resistance. The current through the MOSFET 2 is reduced thereby, causing its drain-to-source voltage to rise. The current through the MOSFET 2 is regulated only until such time as the difference in the input voltages is zero, or in other words until the drain-to-source voltages of the MOSFETs 1 and 2 are the same. This means that in the regulated steady state, a current flows through the measuring resistor 5 that is always firmly proportional to the load current, regardless of the size of the load 4. If the load 4 changes in the course of operation, for instance from a partial short circuit or from a failure of some parallel-connected loads, then the drain-to-source voltage at the power MOSFET 1 also increases or decreases, and thus the variable resistor 6 is controlled in the direction of a lesser or greater resistance, until the voltage difference at the input of the amplifier 3 is zero.

A prerequisite for the fixed proportionality is that $I_D/U_{DS}$ characteristic curves of the MOSFETs 1 and 2 are similar to one another. That is, for each voltage value $U_{DS}$, a current which is a fixed fraction of the load current flows through the further FET 2. At the resistor 5, this current generates a voltage that is referred to ground and is proportional to the load current and can be picked up at the terminal 10. The similarity can readily be attained by providing that the MOSFET 2 is formed by a few cells of the power MOSFET 1, as noted at the outset. The ratio may, for instance, be 10:10,000.

If the characteristic curves are not similar to one another, then a control error which is dependent on the load current occurs.

Figure 2:
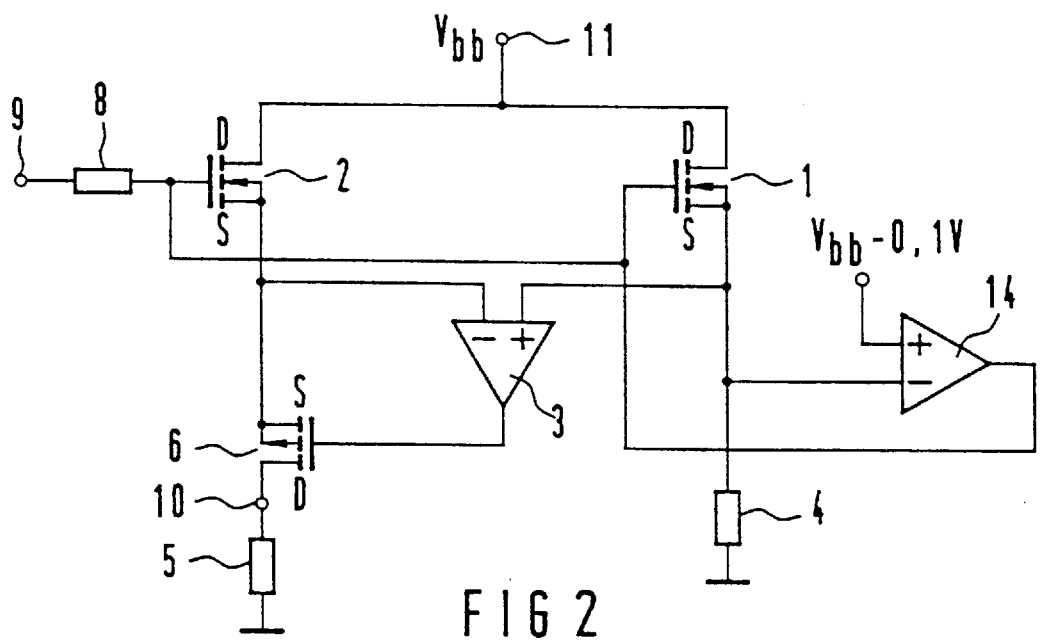
FIG. 2 is a diagram showing an expanded circuit configuration.

The circuit configuration of FIG. 2 differs from that of FIG. 1 by having an additional differential amplifier 14, with one input which is connected to the source terminal of the power MOSFET 1. A fixed voltage is applied to another input of the differential amplifier 14. An output of the differential amplifier 14 is connected to the gate terminals of the MOSFETs 1 and 2. The additional differential amplifier 14 serves the purpose of adjusting the drain-to-source voltage of the MOSFET 1 to a value that is higher than the offset voltage of the differential amplifier 3. For instance, if the offset voltage is 5 mV, then the voltage at the second input of the amplifier 14 can, for instance, be $V_{bb}$–0.1 V. The drain-to-source voltage of the MOSFET is thus set at 0.1 V. At the aforementioned magnitude of the offset voltage, the control error then amounts to only 5/100 mV=5%. Increasing the drain-to-source voltage at the MOSFET 1 by 0.1 V, for instance, only insignificantly increases the on-state resistance of the power MOSFET. Therefore, the increase in the losses in the power MOSFET 1 is negligibly slight.

Figure 3:
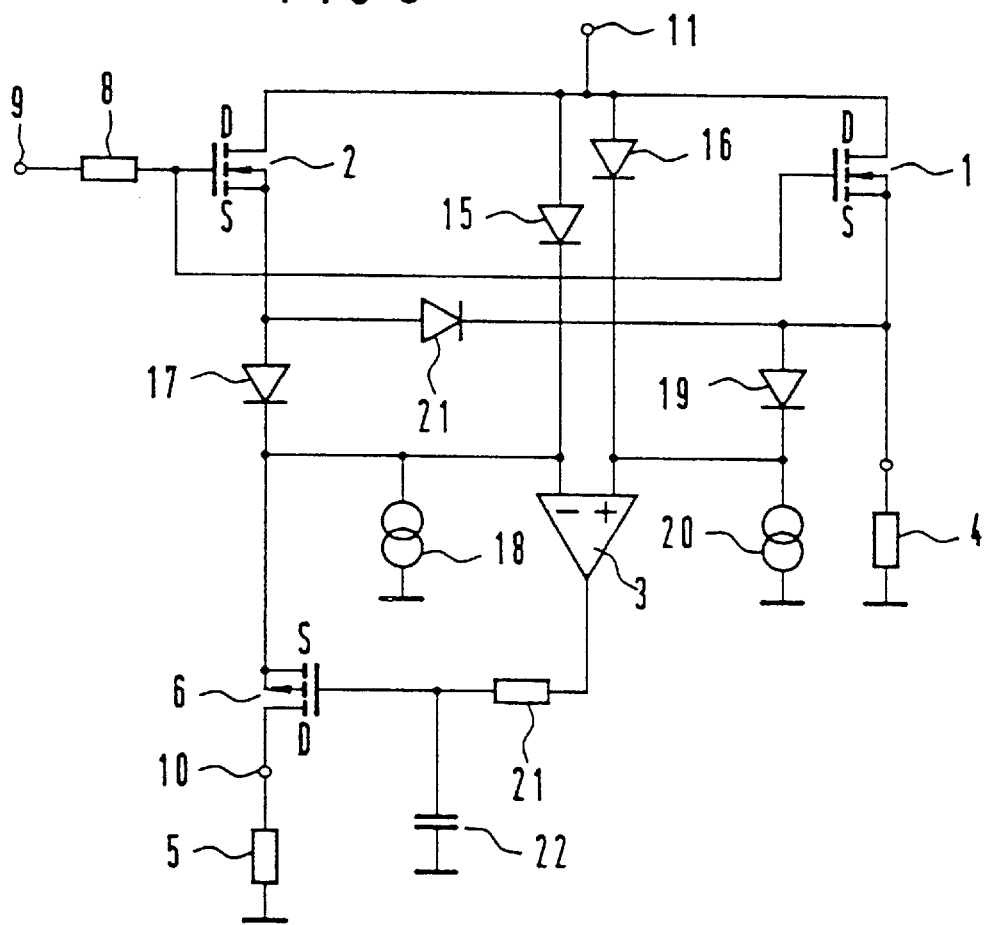
FIG. 3 is a diagram showing an exemplary embodiment that has been expanded with various components as compared to that of FIG. 1.

The exemplary embodiment of FIG. 3 has been expanded by several components over that of FIG. 1. Thus the negative input of the amplifier 3 is connected through a diode 15 to the terminal 11 and through a current source 18 to ground. The positive input of the amplifier 3 is connected through a diode 16 to the terminal 11 and through a current source 20 to ground. The negative input is also connected through a diode 17 to the source terminal of the MOSFET 2, and the positive input is connected through a diode 19 to the source terminal of the power MOSFET 1. The diodes and current sources serve to set the correct operating point for the amplifier 3. All of the diodes may be constructed as MOS diodes and the current sources may be constructed as a current mirror circuit or as depletion MOSFETs.

A resistor 21 may be connected between the output of the amplifier 3 and the gate terminal of the MOSFET 6. One terminal of the resistor 21, which is connected to the gate terminal of the MOSFET 6, is connected to a capacitor 22. Another terminal of the capacitor is connected to ground. This RC combination counteracts the tendency of the amplifier 3 to oscillate. The amplifier 3 is expediently an operational amplifier.

The circuit of the invention can be operated substantially independently of temperature, if the measuring resistor 5 itself is temperature-independent or only slightly temperature-dependent. This can be attained by providing, for instance, that the measuring resistor 5 is formed of polysilicon or is constructed as a temperature-compensated resistor.

The invention has been explained in terms of a high-side switch. However, it can also be used for a low-side switch. In that case the load 4 is located on the drain side of the two MOSFETs, while the controllable switch 6 and the measuring resistor 5 remain connected to the source side of the MOSFET 2.

We claim:

1. A circuit assembly, comprising:

a field-effect-controllable power semiconductor component having a drain terminal, a source terminal, a gate terminal, a drain-to-source voltage and a load current; and a circuit configuration for detecting the load current of said field-effect-controllable power semiconductor component, said circuit configuration including:

a further field-effect-controllable semiconductor component through which a fraction of the load current flows, said further field-effect-controllable semiconductor component having a drain terminal connected to the drain terminal of said field-effect-controllable power semiconductor component, a gate terminal connected to the gate terminal of said field-effect-controllable power semiconductor component, a source terminal and a drain-to-source voltage, a fixed potential terminal, one resistor at which a voltage proportional to the load current can be picked up, said one resistor being connected to said fixed potential terminal, and a controllable resistor connected between said one resistor and the source terminal of said further field-effect-controllable semiconductor component, said controllable resistor adjusting the current of said further field-effect-controllable semiconductor component for setting the drain-to-source voltages of said field-effect-controllable power semiconductor component and said further field-effect-controllable semiconductor component equal to one another, a differential amplifier having a first input connected to the source terminal of said field-effect-controllable power semiconductor component, a second input connected to the source terminal of said further field-effect-controllable semiconductor component and an output, said controllable resistor being a MOSFET having a control input connected to the output of said differential amplifier, and a further differential amplifier having a first input connected to the source terminal of said field-effect-controllable power semiconductor component and a second input receiving a voltage being greater than an offset voltage of said differential amplifier connected to said controllable resistor.

2. The circuit assembly according to claim 1, wherein said differential amplifier is an operational amplifier.

3. The circuit assembly according to claim 1, wherein said fixed potential terminal is a ground potential terminal.

4. The circuit assembly according to claim 1, wherein said field-effect-controllable power semiconductor component and said further field-effect-controllable semiconductor component have similar $I_D/U_{DS}$ characteristic curves.

5. The circuit assembly according to claim 1, wherein said field-effect-controllable power semiconductor component and said further field-effect-controllable semiconductor component include many cells integrated on a single chip.

* * * * *